United States Patent
Ogawa

(10) Patent No.: US 9,722,516 B2
(45) Date of Patent: Aug. 1, 2017

(54) MOTOR DRIVE CIRCUIT AND METHOD

(71) Applicant: SEMICONDUCTOR COMPONENTS INDUSTRIES, LLC, Phoenix, AZ (US)

(72) Inventor: Takashi Ogawa, Gifu-ken (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 103 days.

(21) Appl. No.: 14/693,050

(22) Filed: Apr. 22, 2015

(65) Prior Publication Data

US 2016/0315569 A1 Oct. 27, 2016

(51) Int. Cl.
*H02K 29/08* (2006.01)
*H03K 5/00* (2006.01)
*H02P 6/16* (2016.01)
*G01R 23/00* (2006.01)
*H02P 27/08* (2006.01)

(52) U.S. Cl.
CPC ............... *H02P 6/16* (2013.01); *G01R 23/00* (2013.01); *H02P 27/085* (2013.01)

(58) Field of Classification Search
CPC ............... H02P 6/16; H02P 6/28; H02P 6/20
USPC ................................................ 318/400.38
See application file for complete search history.

(56) References Cited

U.S. PATENT DOCUMENTS

2016/0118916 A1* 4/2016 Gohara ............... H02P 6/008
318/400.13

FOREIGN PATENT DOCUMENTS

JP 2009-198359 * 9/2009

OTHER PUBLICATIONS

Datasheet, AK8788, Asahi Kasei Microdevices (AKM) Corporation, pp. 23-27, Apr. 4, 2012.

* cited by examiner

*Primary Examiner* — Bentsu Ro
*Assistant Examiner* — Zemenay Truneh
(74) *Attorney, Agent, or Firm* — Rennie William Dover

(57) ABSTRACT

In accordance with an embodiment, a drive circuit is provided for driving for a motor wherein the drive circuit includes a first signal generator coupled to a second signal generator. A bias generator is connected to the second signal generator. In accordance with another embodiment, a method for driving a motor is provided that includes comparing a first signal at a first output of a Hall sensor with a second signal at a second output of the Hall sensor to generate a comparison signal. An indicator signal is generated in response to the comparison signal, wherein the indicator signal has a first edge and a second edge. A bias signal for the Hall sensor is generated in response to the indicator signal in response to the indicator signal.

9 Claims, 7 Drawing Sheets

MOTOR DRIVE CIRCUIT AND METHOD

BACKGROUND

The present invention relates, in general, to motors and, more particularly, to three phase motors.

Multi-phase motors are used in a variety of applications including disc drives, digital video disc players, scanners, printers, plotters, actuators used in automotive and aviation industries, etc. Generally, multiple phase motors include a stationary portion or stator that produces a rotating magnetic field and a non-stationary portion or rotor in which torque is created by the rotating magnetic field. The torque causes the rotor to rotate which in turn causes a shaft connected to the rotor to rotate. The motors are driven by motor drive circuits.

Motor drive circuits are designed to meet desired motor performance parameters which may include noise level specifications, start-up specifications, maximum rotational speed specifications, etc. Noise specifications may be set to provide continuity of current flow during motor startup, or during motor rotation, or during motor stoppage. Start-up or motive power specifications may be set so that the motor reliably starts. Rotational speed specifications may be set to ensure there is sufficient torque drive to cover a large number of different motors. For example, the desired rotational speed of a server is higher than that of a personal computer. It is commonly believed that three-phase motors are better at achieving the desired specifications compared to single phase motors; however, three-phase motors cost more than single phase motors. In addition, three-phase motors provide current having sinusoidal characteristics from motor start-up to motor stoppage or cessation and they allow accurate determination of motor position and rotation speed. Three-phase motors typically include three Hall sensors, which is one of the reasons these motors are more expensive to manufacture. A Hall sensor may be referred to as a Hall element. U.S. Pat. No. 6,359,406 issued to Hsien-Lin Chiu et al. on Mar. 19, 2002, discloses three-phase motors and in particular discloses a three-phase motor having two Hall sensors or two Hall elements. A drawback with this technology is that it uses special bias circuitry that complicates its design and increases costs. A technique to lower the cost of three-phase motors is to manufacture the motor drive circuitry as a sensorless motor drive circuit, i.e., a motor without sensors. U.S. Pat. No. 6,483,279 issued to Shinichi Miyazaki et al. on Nov. 19, 2002, discloses a three-phase motor without sensors. A drawback with sensor-less motor drive configurations is that they may fail to start if the inductive voltage of the coil is small.

Accordingly, it would be advantageous to have a multi-phase motor drive circuit and a method for driving the motor that is not overly complex and that can handle small inductive coil voltages. It is desirable for the multi-phase drive circuit and method to be cost and time efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

Figure 1:
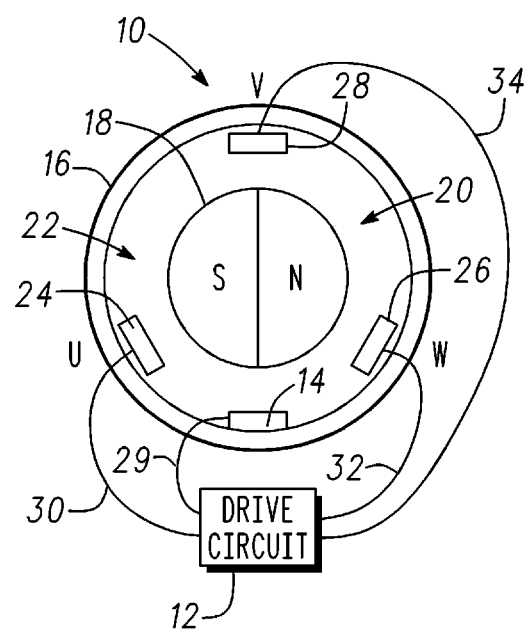
FIG. 1 is a diagrammatic representation of a motor that is driven by a drive circuit in accordance with an embodiment of the present invention.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or an anode of a diode, and a control electrode means an element of the device that controls current flow through the device such as a gate of an MOS transistor or a base of a bipolar transistor. Although the devices are explained herein as certain n-channel or p-channel devices, or certain n-type or p-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action and the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described.

It should be noted that a logic zero voltage level ($V_L$) is also referred to as a logic low voltage or logic low voltage level and that the voltage level of a logic zero voltage is a function of the power supply voltage and the type of logic family. For example, in a Complementary Metal Oxide Semiconductor (CMOS) logic family a logic zero voltage may be thirty percent of the power supply voltage level. In a five volt Transistor-Transistor Logic (TTL) system a logic zero voltage level may be about 0.8 volts, whereas for a five volt CMOS system, the logic zero voltage level may be about 1.5 volts. A logic one voltage level ($V_H$) is also referred to as a logic high voltage level, a logic high voltage, or a logic one voltage and, like the logic zero voltage level, the logic high voltage level also may be a function of the power supply and the type of logic family. For example, in a CMOS system a logic one voltage may be about seventy percent of the power supply voltage level. In a five volt TTL system a logic one voltage may be about 2.4 volts, whereas for a five volt CMOS system, the logic one voltage may be about 3.5 volts.

DETAILED DESCRIPTION

FIG. 1 is a diagrammatic representation of a three-phase motor 10 that is driven by a drive circuit 12 in response to one or more signals from a Hall sensor 14 in accordance with an embodiment of the present invention. Drive circuit 12 may be referred to as a driver and Hall sensor 14 may be referred to as a Hall element. Three-phase motor 10 includes a stator 16 and a rotor 18 having a portion 20 magnetized with a first magnetic pole and a portion 22 magnetized with a second magnetic pole. By way of example, portion 20 is a north pole and portion 22 is a south pole. A coil 24 is coupled to or mounted on a portion of stator 16, a coil 26 is coupled to or mounted on another portion of stator 16, and a coil 28 is coupled to or mounted on yet another portion of stator 16. Drive circuit 12 is coupled to Hall sensor 14 via an electrical interconnect 29, to coil 24 via an electrical interconnect 30, to coil 26 via an electrical interconnect 32, and to coil 28 through an electrical interconnect 34. Coil 24 may be referred to as a U-phase winding, coil 26 may be referred to as a W-phase winding, and coil 28 may be referred to as a V-phase winding. Electrical interconnects 30, 32, and 34 may be wires, electrically conductive traces, or the like.

Figure 2:
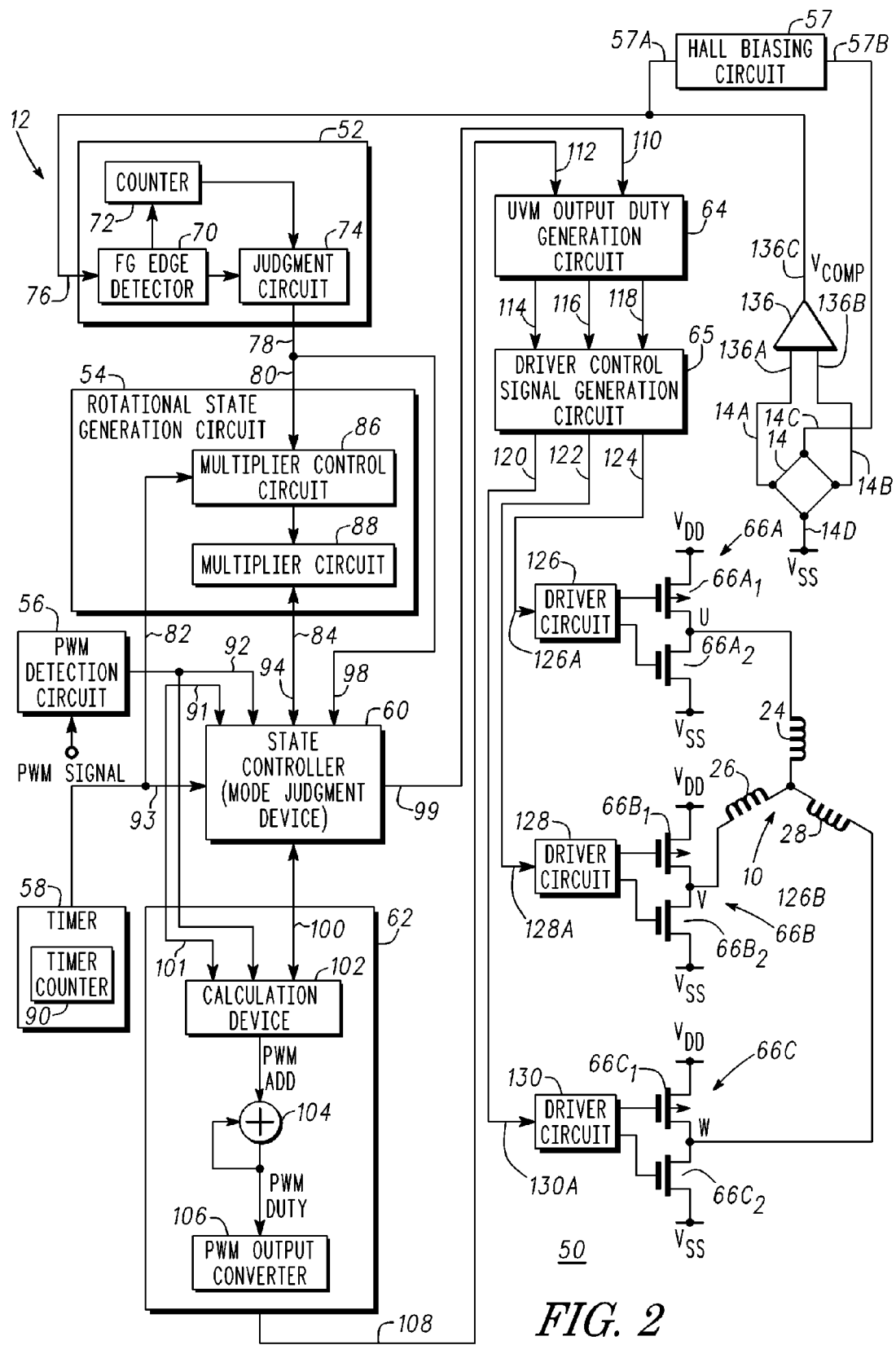
FIG. 2 is a block diagram further illustrating the drive circuit of FIG. 1.

FIG. 2 is a block diagram 50 further illustrating drive circuit 12. It should be noted that block diagram 50 includes diagrammatic representations of drive circuit 12, three-phase motor 10, and Hall sensor 14. Drive circuit 12 includes an FG signal masking circuit 52, a rotational state generation circuit 54, a pulse width modulation ("PWM") detection circuit 56, a Hall biasing circuit 57, a timer 58, a status controller 60, a duty control controller 62, an output duty generation circuit 64, a drive control signal generation circuit 66, and an output drive stage 68. More particularly, FG signal masking circuit 52 may be comprised of an FG signal edge detector 70, a counter 72, and an FG signal judgment circuit 74. FG signal edge detector 70 has an input that serves as an input 76 of drive circuit 12, an output connected to an input of counter 72 and an output connected to an input of FG signal judgment circuit 74. An output 78 of FG signal judgment circuit 74 serves as an output of FG signal masking circuit 52. FG signal masking circuit 52 may be referred to as a chattering mitigation circuit or a chattering mitigation feature.

Rotational state generation circuit 54 has inputs 80 and 82, an input/output 84, and may be referred to as an FG generation circuit. Output 78 of FG signal masking circuit 52 is connected to input 80 of FG generation circuit 54. Input/output 84 may be referred to as an input/output node, an I/O node, an input/output terminal, an I/O terminal, or the like. Rotational state generation circuit 54 may be comprised of a control circuit 86 coupled to a multiplier circuit 88. It should be noted that input 80 and input 84 are connected to multiplier control circuit 86 and input/output 84 is connected to multiplier circuit 88. PWM detection circuit 56 has an output connected to an input of state controller 60 and to an input of duty control controller 62 and is configured to determine the speed of rotor 18. It should be noted that if the duty range is small the speed of the rotor is smaller than if the duty range is large.

Timer 58 has an output connected to input 82 of rotational state generation circuit 54 and to an input 92 of state controller 60 and may include a timer counter 90. In addition, state controller 60 has an input/output 94 connected to an input/output 84 of rotational state generation circuit 54, an input 98 connected to output 78 of FG signal masking circuit 52, and an input/output 96 connected to an input/output 100 of duty control controller 62. By way of example, duty control controller 62 is comprised of a calculation device 102 configured to determine an amount of change to the duty cycle, a summer 104, and a PWM converter 106. Calculation device 102 has an input that serves as input/output 100 and an output connected to an input of summer 104. In addition, summer 104 has an output that is connected to an input of PWM output converter 106 and to another input of summer 104. An output 108 of PWM output converter 106 serves as an output of duty control controller 62. State controller 60 is configured for determining the status or condition of the FG signal and the PWM signal and duty control controller 62 is configured to control an output sine wave, which helps to make the motor quieter.

Output duty generation circuit 64 has an input 110 connected to an output 99 of state controller 60, an input 112 connected to output 108 of output duty generation circuit 62, and a plurality of outputs 114, 116, and 118 connected to corresponding inputs of drive control signal generation circuit 66, which signal generation circuit 66 has a plurality of outputs 120, 122, and 124 connected to corresponding inputs of output drive stage 68. In accordance with an embodiment, drive stage 68 includes driver devices 126, 128, and 130 having inputs that serve as inputs 126A, 128A, and 130A of output drive stage 68, a pair 66A of transistors having a terminal connected to U-phase winding 24, a pair 66B of transistors having a terminal connected to W-phase winding 26, and a pair 66C of transistors having a terminal connected to V-phase winding 28. Pair of transistors 66A is comprised of transistors $66A_1$ and $66A_2$, wherein each transistor has a control electrode, and a pair of current carrying electrodes. The control electrodes of transistors $66A_1$ and $66A_2$ are coupled for receiving control signals from driver device 126, a current carrying electrode of transistor $66A_1$ is coupled for receiving a source of potential $V_{DD}$ and the other current carrying electrode of transistor $66A_1$ is connected to a current carrying electrode of transistor $66A_2$. The other current carrying terminal of transistor $66A_2$ is coupled for receiving a source of potential $V_{SS}$ such as, for example, a ground potential. The commonly connected current carrying electrodes of transistors $66A_1$ and $66A_2$ are connected to U-phase winding 24.

Pair of transistors 66B is comprised of transistors $66B_1$ and $66B_2$, wherein each transistor has a control electrode, and a pair of current carrying electrodes. The control electrodes of transistors $66B_1$ and $66B_2$ are coupled for receiving control signals from driver device 128, a current carrying electrode of transistor $66B_1$ is coupled for receiving a source of potential $V_{DD}$ and the other current carrying electrode of transistor $66B_1$ is connected to a current carrying electrode of transistor $66B_2$. The other current carrying terminal of transistor $66B_2$ is coupled for receiving a source of operating potential $V_{SS}$ such as, for example, a ground potential. The commonly connected current carrying electrodes of transistors $66B_1$ and $66B_2$ are connected to U-phase winding 26.

Pair of transistors 66C is comprised of transistors $66C_1$ and $66C_2$, wherein each transistor has a control electrode, and a pair of current carrying electrodes. The control electrodes of transistors $66C_1$ and $66C_2$ are coupled for receiving control signals from driver device 130, a current carrying electrode of transistor $66C_1$ is coupled for receiving a source of potential $V_{DD}$ and the other current carrying electrode of transistor $66C_1$ is connected to a current carrying electrode of transistor $66C_2$. The other current carrying terminal of transistor $66C_2$ is coupled for receiving a source of operating potential $V_{SS}$ such as, for example, a ground potential. The commonly connected current carrying electrodes of transistors $66C_1$ and $66C_2$ are connected to U-phase winding 28.

A comparator 136 has inputs 136A and 136B connected to terminals 14A and 14B, respectively, of Hall sensor 14 and an output 136C connected to input 57A of Hall biasing circuit 57 and to an input 76 of rotational state generation circuit 54. Comparator 136 may be referred to as a Hall comparator and generates an output signal $V_{COMP}$ at output 136C.

It should be noted that in accordance with an alternative embodiment, FG signal masking circuit 52 is absent from drive circuit 12 and that output 136C of comparator 136 is commonly connected to input 76 of rotational state generation circuit 54 and to input 98 of state controller 60.

Figure 3:
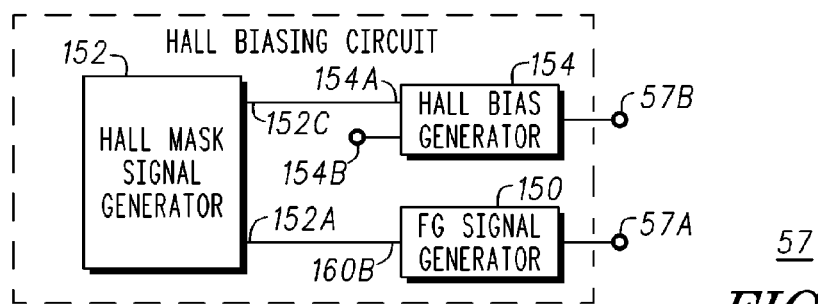
FIG. 3 is a block diagram of a biasing circuit in accordance with another embodiment of the present invention.

FIG. 3 is a block diagram of Hall biasing circuit 57 in accordance with an embodiment of the present invention. What is shown in FIG. 3 is an FG signal generator 150, a Hall mask signal generator 152, and a Hall bias generator 154. FG signal generator 150 has an input that serves as input 57A of Hall biasing circuit 57 and an output 150B that is connected to an input 152A of Hall mask signal generator 152. Hall bias generator 154 has an input 154A connected to an output 152C of Hall mask signal generator 152, an input 154B connected to state controller 60, and an output that serves as output 57B of Hall biasing circuit 57. Optionally, Hall mask generator 152 has an input 152B.

Figure 4:
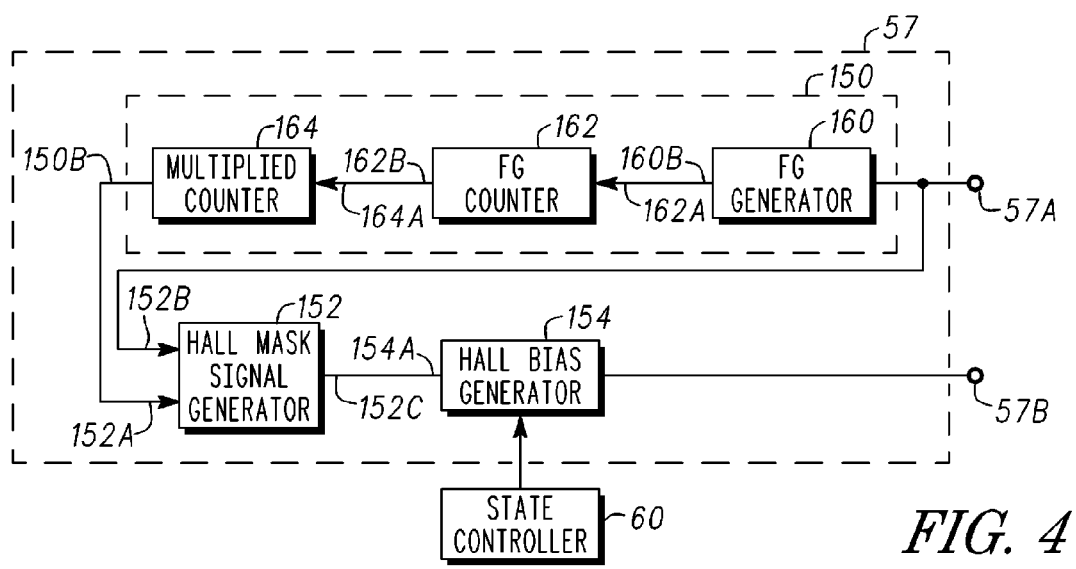
FIG. 4 is a block diagram of the biasing circuit of FIG. 3 in accordance with another embodiment of the present invention.

FIG. 4 is a block diagram of Hall biasing circuit 57 connected to a state controller such as, for example, state controller 60. What is shown in FIG. 4 is FG signal generator 150, Hall mask signal generator 152, and Hall bias generator 154. More particularly, FG signal generator 150 may be comprised of an FG generator 160 having an input that serves as input 57B of Hall biasing circuit 57 and an output 160B connected to an input 162A of an FG counter 162. FG signal generator 150 further includes a multiplied counter 164 having an input 164A connected to an output 162B of FG counter 162. An output of multiplied counter 164 serves as output 150B of FG signal generator 150. FG counter 162 counts the number of pulses generated at output 136C of comparator 136 from the time at which the Hall sensor is on or active to the time at which the Hall sensor turns off or becomes inactive. Multiplied counter 164 divides the count value from FG counter 162. Optionally, the input of FG generator 160 is connected to input 152B of Hall mask signal generator 152.

Figure 5:
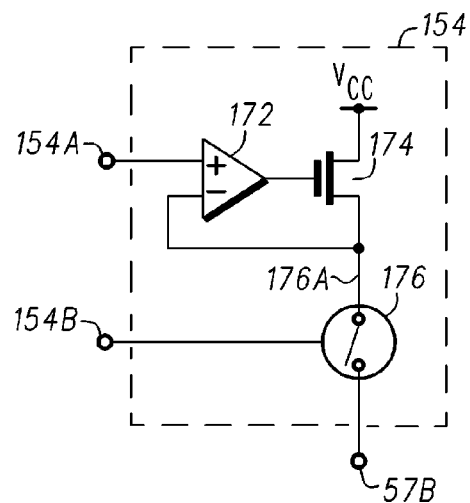
FIG. 5 is a circuit schematic of a control circuit in accordance with an embodiment of the present invention.

FIG. 5 is circuit schematic of Hall bias generator 154 in accordance with an embodiment of the present invention. What is shown in FIG. 4 is an amplifier 172 connected to a transistor 174 and to a switch 176. Amplifier 172 has an inverting input, a noninverting input, and an output, wherein the noninverting input serves as input 154A of Hall bias generator 154. Transistor 174 has a gate connected to the output of amplifier 172, a drain coupled for receiving a source of operating potential $V_{CC}$, and a drain connected to the inverting input of amplifier 172 and to a conduction terminal 176A of switch 176. A conduction terminal of switch 176 is connected to or, alternatively, serves as output 57B of Hall bias generator 154. Switch 176 has a control terminal connected to or, alternatively, serving as input 154B of Hall bias generator 154.

Figure 6:
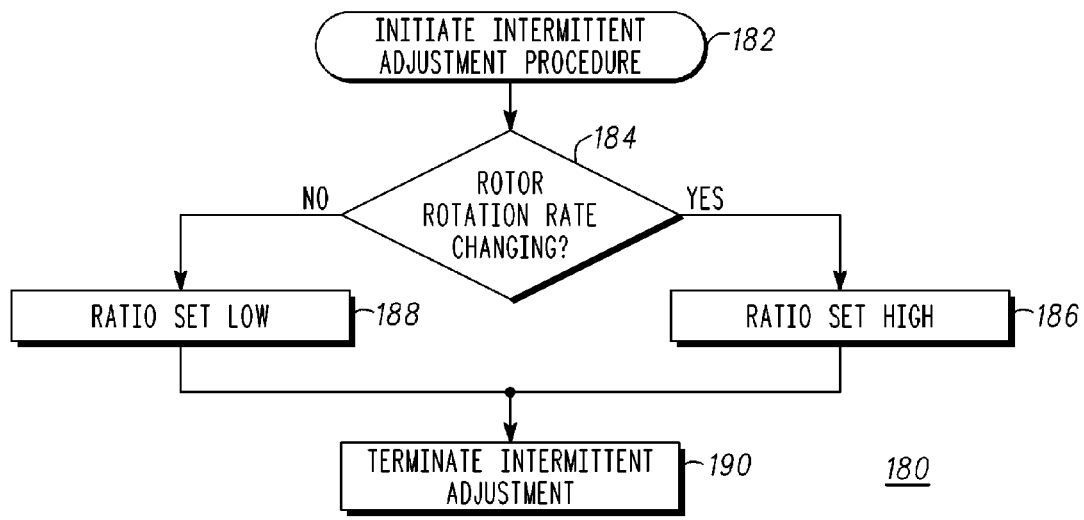
FIG. 6 is a flow diagram illustrating an intermittent adjustment procedure in accordance with an embodiment of the present invention.

FIG. 6 is a flow diagram 180 for adjusting the bias voltage of Hall sensor 14 in accordance with an embodiment of the present invention. In operation, an intermittent ratio adjustment procedure is initiated as indicated by oval 182. At a beginning step, the rotation rate of rotor 18 is monitored or determined. In response to rotor 18 having a substantially constant rotational speed, i.e., the rotational speed of rotor 18 not accelerating or decelerating, Hall bias generator 154 generates a Hall bias signal having a low duty ratio. In response to the rotational speed of rotor 18 increasing or decreasing, Hall bias generator 154 generates a Hall bias signal having a high duty ratio. It should be noted that the high duty ratio and the low duty ratio may be determined in accordance with the motor characteristics. For example, a high duty ratio may be 50% or more. In applications in which the motor operation is stable or substantially constant and changes in the speed is low, a high duty ratio may be 40% or more.

Figure 7:
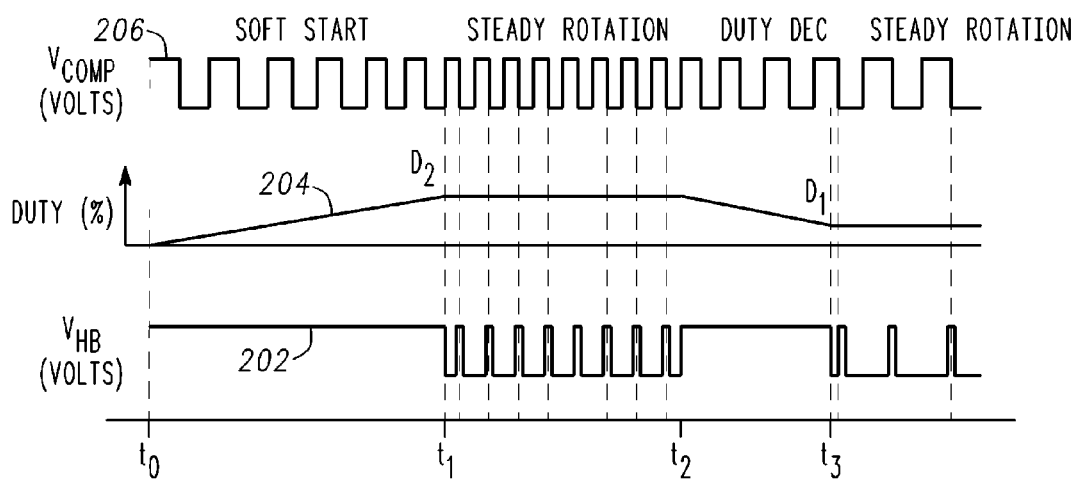
FIG. 7 is a timing diagram illustrating intermittently adjusting a duty in accordance with an embodiment of the present invention.

FIG. 7 is a timing diagram 200 illustrating the application of an intermittent duty adjustment procedure in accordance with embodiments of the present invention. What is shown in FIG. 7 is a comparator output voltage $V_{COMP}$ identified by plot 206, a Hall bias voltage $V_{HB}$ identified by plot 202, and the duty ratio of Hall bias voltage $V_{HB}$ identified by signal plot 204. In response to a soft start procedure, comparator 136 shown in FIG. 2 generates a comparator output signal $V_{COMP}$. In response to comparator output signal $V_{COMP}$, Hall bias generator 154 generates a Hall bias voltage $V_{HB}$ at output 57B shown in FIG. 4. From time $t_0$ to time $t_1$, the duty ratio of Hall bias signal $V_{HB}$ increases to duty ratio $D_2$.

From time $t_1$ to time $t_2$, rotor 18 is in steady state rotation and Hall bias generator 154 generates a Hall bias voltage $V_{HB}$ that is intermittently on and off, i.e., that switches between a logic high voltage level and a logic low voltage level. Thus, Hall bias voltage $V_{HB}$ has a duty $D_2$. Configuring drive circuit 12 to generate a Hall bias signal $V_{HB}$ that is intermittently on and off reduces power consumption of drive circuit 12.

At time $t_2$, Hall bias generator 154 generates a Hall bias voltage $V_{HB}$ at terminal 57B that is at a logic high voltage state $V_H$ resulting in Hall sensor 14 being on. During this period, the duty of Hall bias voltage $V_{HB}$ decreases reaching a duty ratio $D_1$ at time $t_3$. At time $t_3$, Hall bias generator 154 generates a Hall bias voltage $V_{HB}$ that is intermittently on and off, i.e., that switches between a logic high voltage level and a logic low voltage level. Configuring drive circuit 12 to generate a Hall bias signal $V_{HB}$ that is intermittently on and off reduces the power consumption of drive circuit 12.

Figure 8:
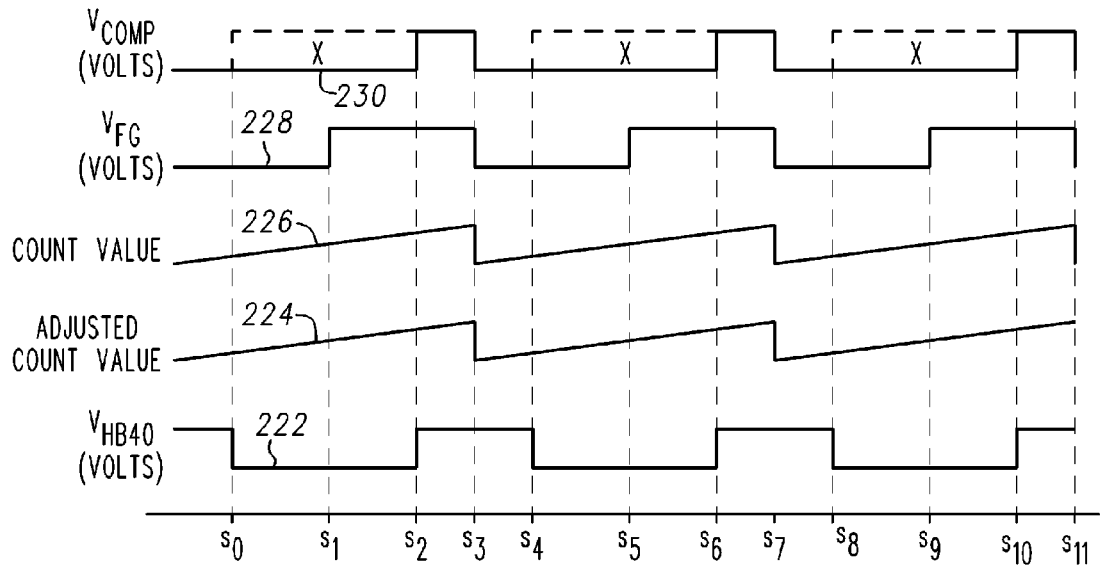
FIG. 8 is another timing diagram illustrating intermittently adjusting a duty in accordance with an embodiment of the present invention.

Referring now to FIG. 8, a timing diagram 220 illustrating the application of an intermittent duty adjustment procedure in accordance with embodiments of the present invention is shown. Timing diagram 220 illustrates comparator output $V_{COMP}$ identified by plot 230, FG output $V_{FG}$ identified by plot 228, an FG count value identified by plot 226, an adjusted count value identified by plot 224, and a Hall bias voltage $V_{HB40}$ having a duty ratio of 40% identified by plot 232. More particularly, timing diagram 220 is an expanded view of a portion of timing diagram 200 during, for example, a portion of the time between times $t_1$ and $t_2$. At time $s_0$ of timing diagram 220, comparator voltage $V_{COMP}$ and FG voltage $V_{FG}$ are at logic low voltage levels. Between times $s_0$ and $s_2$, the count value and, thus, the adjusted count value of plots 226 and 228, respectively, are increasing. FG generator 160 is configured to cause FG voltage level $V_{FG}$ to transition from a logic low voltage level to a logic high voltage level at time $s_1$. It should be noted that FG generator 160 is configured to cause FG voltage $V_{FG}$ to increase from the logic low voltage level to the logic high voltage level during the time period or interval between times $s_0$ and $s_2$ and that FG generator 160 may be configured to cause FG voltage $V_{FG}$ to increase to the logic high voltage level at time $s_2$.

At time $s_2$, comparator voltage $V_{COMP}$ transitions from a logic low voltage level to a logic high voltage level, which causes Hall bias voltage $V_{HB40}$ to transition to a logic high voltage level. In accordance with an embodiment, FG signal generator 150 is configured to generate a Hall bias voltage $V_{HB}$ having a duty of 40% as shown in plot 232. It should be noted that reference character 40 has been appended to Hall bias voltage $V_{HB}$ to indicate that the Hall bias voltage $V_{HB40}$ has a duty of 40%.

At time $s_3$, comparator voltage $V_{COMP}$ transitions from a logic high voltage level to a logic low voltage level, which causes FG voltage $V_{FG}$ to transition from a logic high voltage level to a logic low voltage level, counter 162 to reset and begin counting from zero, and the adjusted count value to reset and begin counting from zero. Because FG signal generator 150 is configured to generate a Hall bias voltage $V_{BH40}$ having a duty of 40%, it approximates that half of the time that Hall bias voltage $V_{HB40}$ is at a logic high voltage level for the 40% duty occurs from time $s_2$ to time $s_3$ and determines that the remaining portion of the time for Hall bias voltage $V_{HB40}$ to be at a logic high voltage level occurs from time $s_3$ to time $s_4$. Thus, Hall bias voltage $V_{HB40}$ transitions from a logic high voltage level to a logic low voltage level at time $s_4$.

At time $s_4$ of timing diagram 220, comparator voltage $V_{COMP}$ and FG voltage $V_{FG}$ are at logic low voltage levels. FG generator 160 is configured to cause FG voltage level $V_{FG}$ to transition from a logic low voltage level to a logic high voltage level at time $s_5$. It should be noted that between times $s_3$ and $s_7$, the count value and the adjusted count value of plots 226 and 228, respectively, are increasing and that FG generator 160 is configured to cause FG voltage $V_{FG}$ to increase from the logic low voltage level to the logic high voltage level during the time period or interval between times $s_3$ and $s_7$. It should be noted that FG generator 160 may be configured to cause FG voltage $V_{FG}$ to increase to the logic high voltage level at time $s_6$.

At time $s_6$, comparator voltage $V_{COMP}$ transitions from a logic low voltage level to a logic high voltage level, which causes Hall bias voltage $V_{HB40}$ to transition to a logic high voltage level. In accordance with an embodiment, FG signal generator 150 is configured to generate a Hall bias voltage $V_{HB}$ having a duty of 40% as shown in plot 222.

At time $s_7$, comparator voltage $V_{COMP}$ transitions from a logic high voltage level to a logic low voltage level, which causes FG voltage $V_{FG}$ to transition from a logic high voltage level to a logic low voltage level, counter 162 to reset and begins counting from zero, and the adjusted count value to reset and begins counting from zero. Because FG signal generator 150 is configured to generate a Hall bias voltage $V_{BH40}$ having a duty of 40%, it approximates that half of the time that Hall bias voltage $V_{HB40}$ is at a logic high voltage level for the 40% duty occurs from time $s_6$ to time $s_7$ and determines that the remaining portion of the time for Hall bias voltage $V_{HB40}$ to be at a logic high voltage level occurs from time $s_4$ to time $s_8$. Thus, Hall bias voltage $V_{HB40}$ transitions from a logic high voltage level to a logic low voltage level at time $s_8$.

At time $s_8$ of timing diagram 220, comparator voltage $V_{COMP}$ and FG voltage $V_{FG}$ are at logic low voltage levels. FG generator 160 is configured to cause FG voltage level $V_{FG}$ to transition from a logic low voltage level to a logic high voltage level at time $s_9$. It should be noted that between times $s_7$ and $s_{10}$, the count value and the adjusted count value of plots 226 and 228, respectively, are increasing and that FG generator 160 is configured to cause FG voltage $V_{FG}$ to increase from the logic low voltage level to the logic high voltage level during the time period or interval between times $s_7$ and $s_{11}$. It should be noted that FG generator 160 may be configured to cause FG voltage $V_{FG}$ to increase to the logic high voltage level at time $s_{11}$.

At time $s_{14}$, comparator voltage $V_{COMP}$ transitions from a logic low voltage level to a logic high voltage level, which causes Hall bias voltage $V_{HB40}$ to transition to a logic high voltage level. In accordance with an embodiment, FG signal generator 150 is configured to generate a Hall bias voltage $V_{HB}$ having a duty of 40% as shown in plot 232.

It should be noted that the times marked with an X between times $s_0$ and $s_2$, between times $s_4$ and $s_6$, and between times $s_8$ and $s_{10}$ illustrate time intervals over which the output of Hall comparator 136 is unsettled, wherein the output voltage at terminal 136C changes value but does not affect the circuit operation because Hall mask signal generator 152 masks comparator output signal $V_{COMP}$ from changing Hall bias voltage $V_{HB40}$.

Figure 9:
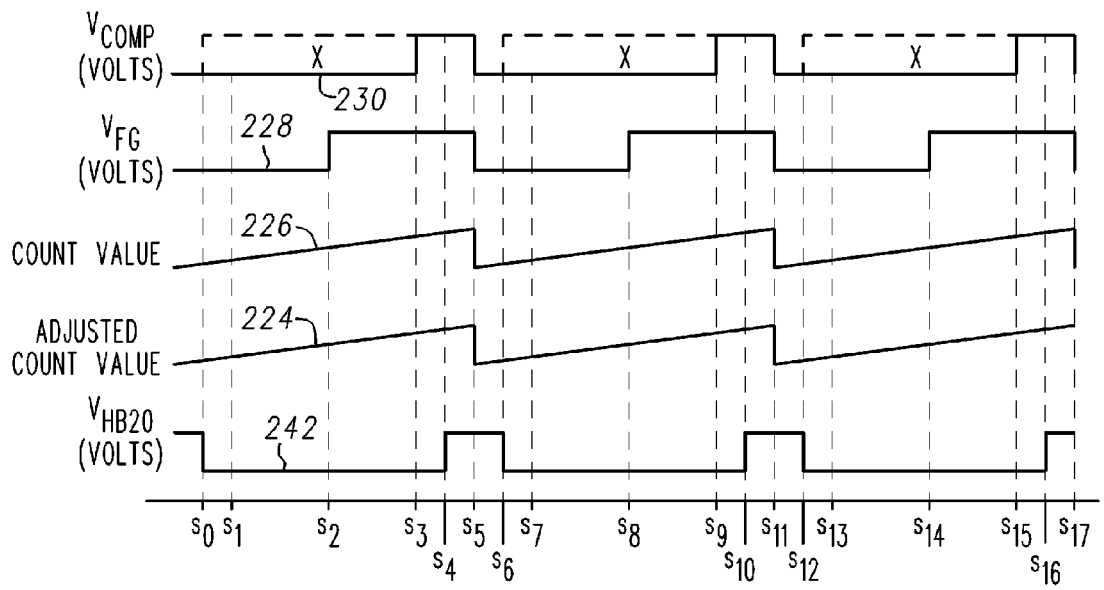
FIG. 9 is another timing diagram illustrating intermittently adjusting a duty in accordance with an embodiment of the present invention.

Referring now to FIG. 9, a timing diagram 240 illustrating the application of an intermittent duty adjustment procedure in accordance with embodiments of the present invention is shown. Timing diagram 240 illustrates comparator output $V_{COMP}$ identified by plot 230, FG output $V_{FG}$ identified by plot 228, an FG count value identified by plot 226, an adjusted count value identified by plot 224, and a Hall bias voltage $V_{HB20}$ having a duty ratio of 20% identified by plot 242. More particularly, timing diagram 240 is an expanded view of a portion of timing diagram 200 during, for example, a portion of the time between times $t_1$ and $t_2$. At time $s_0$ of timing diagram 240, comparator voltage $V_{COMP}$ and FG voltage $V_{FG}$ are at logic low voltage levels. Between times $s_0$ and $s_3$, the count value and, thus, the adjusted count value of plots 226 and 228, respectively, are increasing. FG generator 160 is configured to cause FG voltage level $V_{FG}$ to transition from a logic low voltage level to a logic high voltage level at time $s_2$. It should be noted that FG generator 160 is configured to cause FG voltage $V_{FG}$ to increase from the logic low voltage level to the logic high voltage level during the time period or interval between times $s_0$ and $s_4$ and that FG generator 160 may be configured to cause FG voltage $V_{FG}$ to increase to the logic high voltage level at time $s_4$.

At time $s_3$, comparator voltage $V_{COMP}$ transitions from a logic low voltage level to a logic high voltage level, which causes Hall bias voltage $V_{HB20}$ to transition to a logic high voltage level at time $s_4$. In accordance with an embodiment, FG signal generator 150 is configured to generate a Hall bias voltage $V_{HB}$ having a duty of 20% as shown in plot 242. It should be noted that reference character 20 has been appended to Hall bias voltage $V_{HB}$ to indicate that the Hall bias voltage $V_{HB20}$ has a duty of 20%.

At time $s_5$, comparator voltage $V_{COMP}$ transitions from a logic high voltage level to a logic low voltage level, which causes FG voltage $V_{FG}$ to transition from a logic high voltage level to a logic low voltage level, counter 162 to reset and begin counting from zero, and the adjusted count value to reset and begin counting from zero. Because FG signal generator 150 is configured to generate a Hall bias voltage $V_{BH20}$ having a duty of 20%, it approximates that half of the time that Hall bias voltage $V_{HB20}$ is at a logic high voltage level for the 20% duty occurs from time $s_4$ to time $s_5$ and determines that the remaining portion of the time for Hall bias voltage $V_{HB20}$ to be at a logic high voltage level occurs from time $s_5$ to time $s_6$. Thus, Hall bias voltage $V_{HB20}$ transitions from a logic high voltage level to a logic low voltage level at time $s_6$.

At time $s_7$ of timing diagram 220, comparator voltage $V_{COMP}$ and FG voltage $V_{FG}$ are at logic low voltage levels. FG generator 160 is configured to cause FG voltage level $V_{FG}$ to transition from a logic low voltage level to a logic high voltage level at time $s_8$. It should be noted that between times $s_7$ and $s_{10}$, the count value and the adjusted count value of plots 226 and 228, respectively, are increasing and that FG generator 160 is configured to cause FG voltage $V_{FG}$ to increase from the logic low voltage level to the logic high voltage level during the time period or interval between times $s_7$ and $s_{10}$. It should be noted that FG generator 160 may be configured to cause FG voltage $V_{FG}$ to increase to the logic high voltage level at time $s_8$.

At time $s_{11}$, comparator voltage $V_{COMP}$ transitions from a logic low voltage level to a logic high voltage level, which causes Hall bias voltage $V_{HB20}$ to transition to a logic high voltage level. In accordance with an embodiment, FG signal generator 150 is configured to generate a Hall bias voltage $V_{HB}$ having a duty of 20% as shown in plot 242.

At time $s_{11}$, comparator voltage $V_{COMP}$ transitions from a logic high voltage level to a logic low voltage level, which causes FG voltage $V_{FG}$ to transition from a logic high voltage level to a logic low voltage level, counter 162 to reset and begins counting from zero, and the adjusted count value to reset and begins counting from zero. Because FG signal generator 150 is configured to generate a Hall bias voltage $V_{BH20}$ having a duty of 20%, it approximates that half of the time that Hall bias voltage $V_{HB20}$ is at a logic high voltage level for the 20% duty occurs from time $s_{10}$ to time $s_{11}$ and determines that the remaining portion of the time for Hall bias voltage $V_{HB20}$ to be at a logic high voltage level occurs from time $s_{11}$ to time $s_{12}$. Thus, Hall bias voltage $V_{HB20}$ transitions from a logic high voltage level to a logic low voltage level at time $s_{12}$.

At time $s_{13}$ of timing diagram 220, comparator voltage $V_{COMP}$ and FG voltage $V_{FG}$ are at logic low voltage levels. FG generator 160 is configured to cause FG voltage level $V_{FG}$ to transition from a logic low voltage level to a logic high voltage level at time $s_{14}$. It should be noted that between times $s_{13}$ and $s_{15}$, the count value and the adjusted count value of plots 226 and 228, respectively, are increasing and that FG generator 160 is configured to cause FG voltage $V_{FG}$ to increase from the logic low voltage level to the logic high voltage level during the time period or interval between times $s_{13}$ and $s_{15}$. It should be noted that FG generator 160 may be configured to cause FG voltage $V_{FG}$ to increase to the logic high voltage level at time $s_{16}$.

At time $s_{17}$, comparator voltage $V_{COMP}$ transitions from a logic low voltage level to a logic high voltage level.

It should be noted that the times marked with an X between times $s_1$ and $s_3$, between times $s_7$ and $s_9$, and between times $s_{13}$ and $s_{15}$ illustrate time intervals over which the output of Hall comparator 136 is unsettled, wherein the output voltage at terminal 136C changes value but does not affect the circuit operation because Hall mask signal generator 152 masks comparator output signal $V_{COMP}$ from changing Hall bias voltage $V_{HB20}$.

Figure 10:
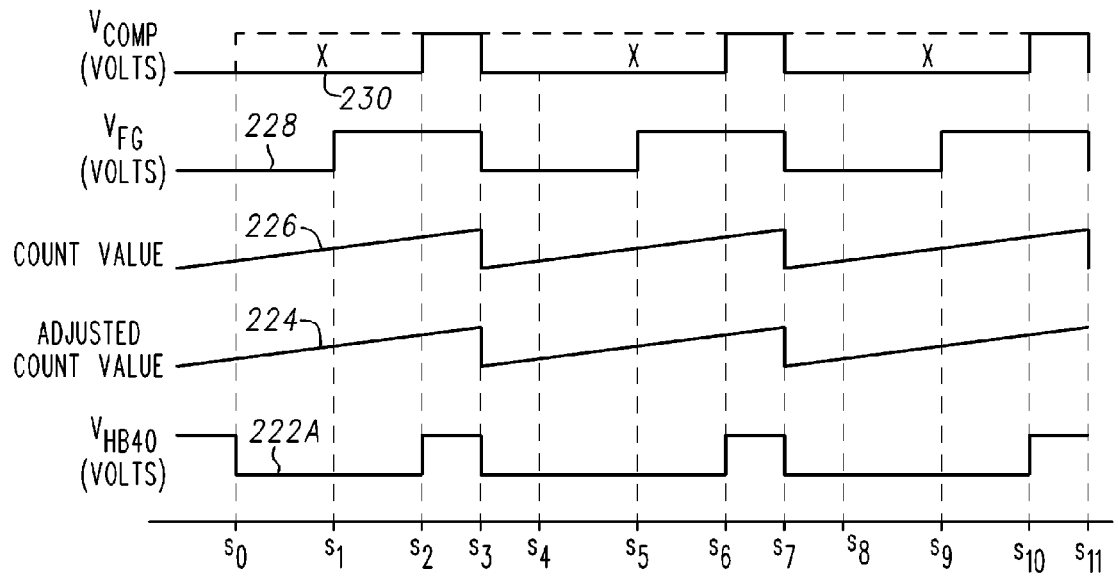
FIG. 10 is another timing diagram illustrating intermittently adjusting a duty in accordance with an embodiment of the present invention.
Figure 11:
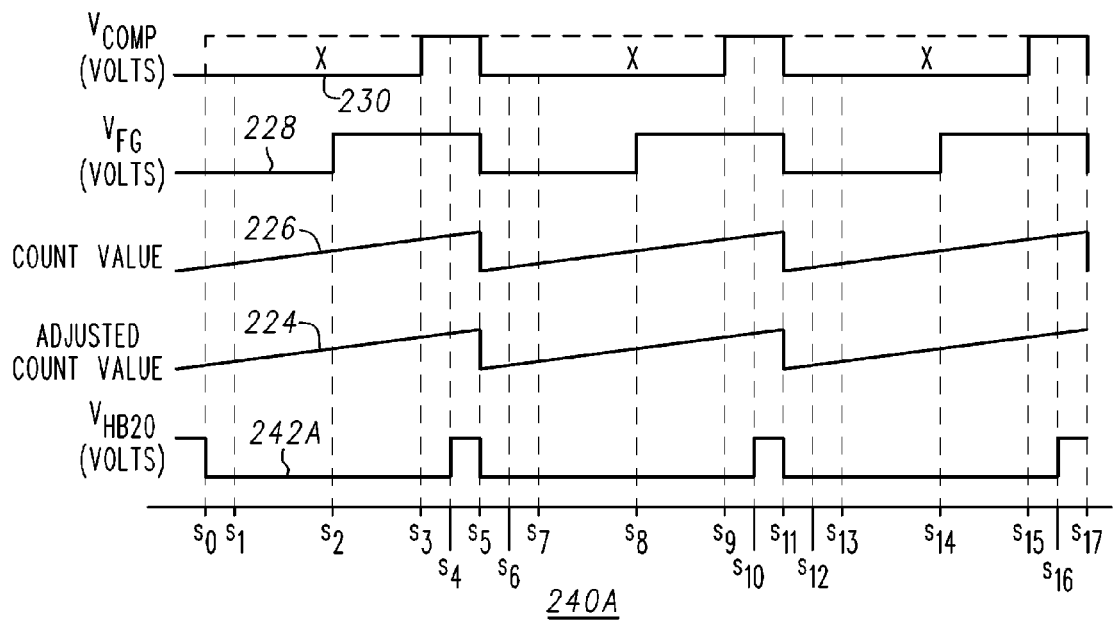
FIG. 11 is another timing diagram illustrating intermittently adjusting a duty in accordance with an embodiment of the present invention.

In accordance with the embodiments shown and described with reference to FIG. 8, there is a delay before Hall bias voltage level $V_{HB40}$ decreases from the high logic voltage level to the low logic voltage level. This delay is indicated as the difference between times $s_4$ and $s_3$ or the difference between times $s_8$ and $s_7$. However this is not a limitation of the present invention. For example, Hall bias voltage level $V_{HB40}$ may change from a logic high voltage level to a logic low voltage level in response to the negative edge of the FG voltage signal, e.g., at times $s_3$ or $s_7$ as illustrated with reference to signal plot 222A of FIG. 10. Similarly, with reference to FIG. 9, there is a delay before Hall bias voltage level $V_{HB20}$ decreases from the high logic voltage level to the low logic voltage level. This delay is indicated as the difference between times $s_6$ and $s_5$ or the difference between times $s_{12}$ and $s_{11}$. However this is not a limitation of the present invention. For example, Hall bias voltage level $V_{HB20}$ may change from a logic high voltage level to a logic low voltage level in response to the negative edge of the FG voltage signal, e.g., at times $s_5$ or $s_{12}$ as illustrated with reference to signal plot 242A of FIG. 11.

Figure 12:
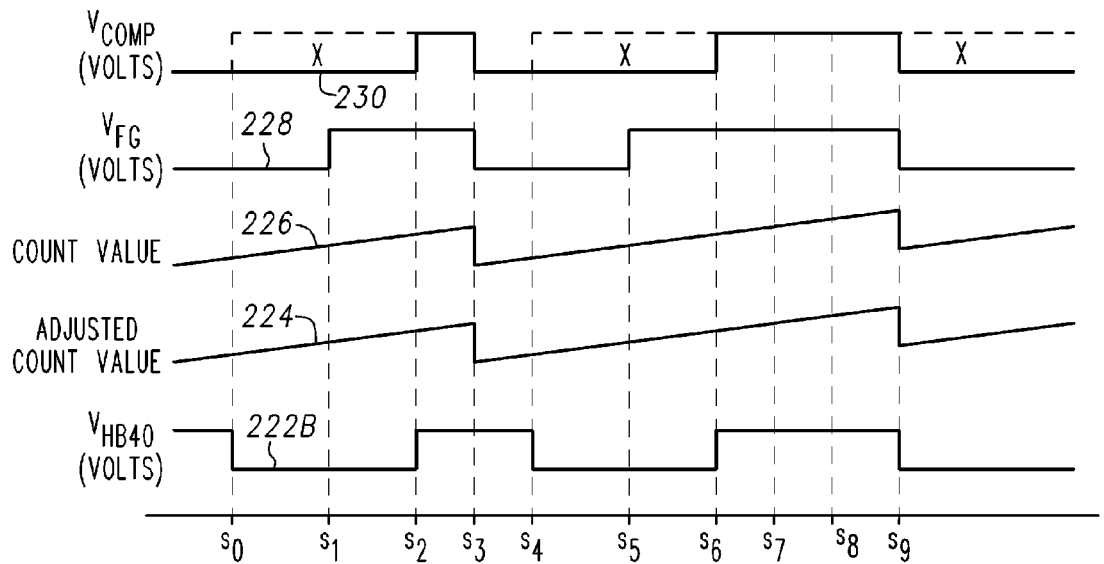
FIG. 12 is another timing diagram illustrating intermittently adjusting a duty in accordance with an embodiment of the present invention.

In accordance with the embodiments shown and described with reference to FIG. 8, each comparison signal $V_{COMP}$ has the same pulse width. However, this is not a limitation of the present invention. For example, FIG. 12 illustrates an embodiment in which the pulse width of comparison signal $V_{COMP}$ begins at time $s_2$ and extends to time $s_3$ (as shown in FIG. 8) but the pulse width of pulse $V_{COMP}$ that begins at time $s_6$ may have a pulse width that is different, e.g., longer, than the width of the pulse that begins at time $s_2$. In accordance with this embodiment, Hall bias voltage $V_{HB40}$ includes a pulse that transitions to a logic high voltage level at time $s_6$ (similar to the corresponding pulse in FIG. 8), but the pulse width of this pulse is extended such that it transitions from a logic high voltage level to a logic low voltage level at time $s_9$. It should be noted that the pulse width of FG voltage $V_{FG}$ is extended so that it transitions from a logic high voltage level to a logic low voltage level at time $s_9$ and the counter continues counting up until time $s_9$ before resetting to a zero count. It should be appreciated that the FG counter detects the period over which the output of comparator 136 has the same polarity, i.e., a logic high voltage level or a logic low voltage level. During the extended time of the signal $V_{COMP}$, the FG counter is locked out from detecting the polarity of the output signal from comparator 136.

Figure 13:
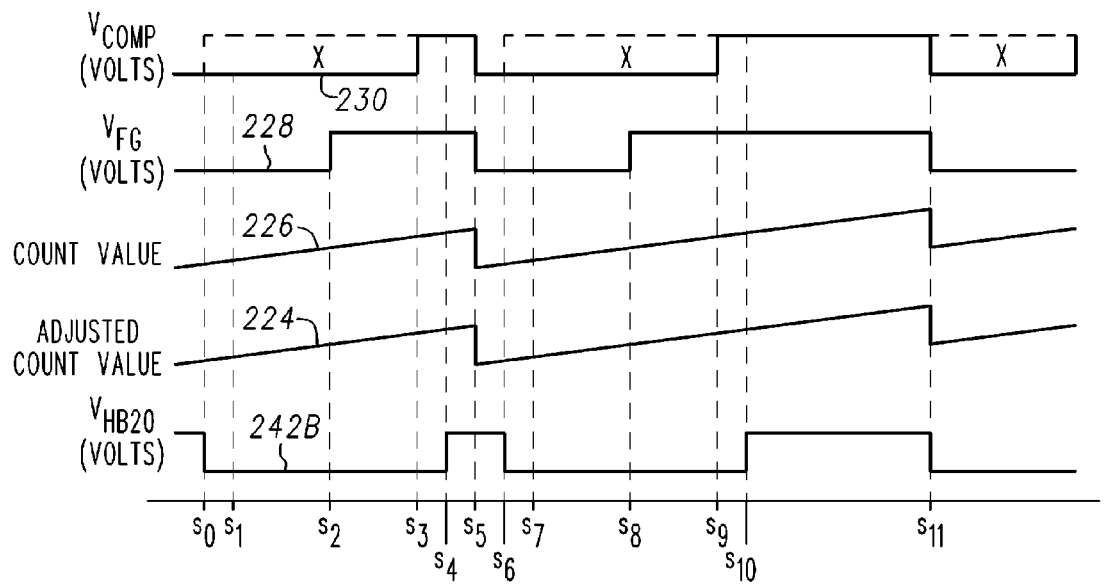
FIG. 13 is another timing diagram illustrating intermittently adjusting a duty in accordance with an embodiment of the present invention.

In accordance with the embodiments shown and described with reference to FIG. 9, each comparison signal $V_{COMP}$ has the same pulse width. However, this is not a limitation of the present invention. For example, FIG. 13 illustrates an embodiment in which the pulse width of comparison signal $V_{COMP}$ begins at time $s_4$ and extends to time $s_3$ (as shown in FIG. 9) but the pulse width of pulse $V_{COMP}$ that begins at time $s_{10}$ may have a pulse width that is different, e.g., longer, than the width of the pulse that begins at time $s_4$. In accordance with this embodiment, Hall bias voltage $V_{HB20}$ includes a pulse that transitions to a logic high voltage level at time $s_{10}$ (similar to the corresponding pulse in FIG. 9), but the pulse width of this pulse is extended such that it transitions from a logic high voltage level to a logic low voltage level at time $s_{11}$. It should be noted that the pulse width of FG voltage $V_{FG}$ is extended so that it transitions from a logic high voltage level to a logic low voltage level at time $s_1$ and the counter continues counting up until time $s_{11}$ before resetting to a zero count. As discussed above, the FG counter detects the period over which the output of comparator 136 has the same polarity, i.e., a logic high voltage level or a logic low voltage level. During the extended time of the signal $V_{COMP}$, the FG counter is locked out from detecting the polarity of the output signal from comparator 136.

Although specific embodiments have been disclosed herein, it is not intended that the invention be limited to the disclosed embodiments. Those skilled in the art will recognize that modifications and variations can be made without departing from the spirit of the invention. It is intended that the invention encompass all such modifications and variations as fall within the scope of the appended claims.

What is claimed is:

1. A bias circuit, comprising:
a first signal generator having an input and an output;
a second signal generator configured to generate a control signal, the second signal generator having a first input terminal, a second input terminal, and an output terminal, the first input terminal of the second signal generator coupled to the output of the first signal generator;
a bias generator having an input terminal and an output terminal, the input terminal of the bias generator coupled to the output terminal of the second signal generator, wherein the bias generator comprises:
an amplifier having a first input, a second input, and an output, the first input of the amplifier serving as the input of the bias generator, the output of the amplifier coupled to the second input of the amplifier;
a switch having a control terminal, a first conduction terminal, and a second conduction terminal, the first conduction terminal serving as a second input of the bias generator and the first conduction terminal coupled to the second input of the amplifier, and the second conduction terminal of the switch serving as the output terminal of the bias generator.

2. The bias circuit of claim 1, further including a state controller coupled to the second input terminal of the second signal generator configured to generate the control signal.

3. The bias circuit of claim 1, further including a counter having an input and an output, the input of the counter coupled to the output of the first signal generator.

4. The bias circuit of claim 3, further including a count adjustment circuit having and input and an output, the input of the count adjustment circuit coupled to the output of the counter and the output of the count adjustment circuit coupled to the first input of the second signal generator.

5. The bias circuit of claim 1, wherein the bias generator further comprises a transistor having a control terminal, a first current carrying terminal, and a second current carrying terminal, the control terminal of the transistor coupled to the output terminal of the amplifier, the first current carrying terminal of the transistor coupled for receiving a first source of operating potential, and the second current carrying terminal of the transistor coupled to the second input terminal of the amplifier.

6. The bias circuit of claim 5, further including a Hall sensor having a first bias terminal and a second bias terminal, the first bias terminal of the Hall sensor coupled to the second conduction terminal of the switch and the second bias terminal of the Hall sensor coupled for receiving a second source of operating potential.

7. A method for biasing a Hall sensor, comprising:
comparing a first signal at a first output of the Hall sensor with a second signal at a second output of the Hall sensor to generate a comparison signal;
generating an indicator signal in response to the comparison signal, wherein the indicator signal has a first edge and a second edge; and
generating a bias signal for a Hall sensor in response to the indicator signal, the bias signal for the Hall sensor having a first edge and a second edge, wherein generating the bias signal for the Hall sensor includes generating the Hall bias signal to have the first edge of the Hall bias signal occur before the second edge of the indicator signal and to have the second edge of the Hall bias signal occur after the second edge of the indicator signal.

8. A method for biasing a Hall sensor, comprising:
comparing a first signal at a first output of the Hall sensor with a second signal at a second output of the Hall sensor to generate a comparison signal;
generating an indicator signal in response to the comparison signal, wherein the indicator signal has a first edge and a second edge; and
generating a bias signal for the Hall sensor in response to the indicator signal, the bias signal for the Hall sensor having a first edge and a second edge, wherein generating the bias signal for the Hall sensor includes generating the Hall bias signal to have the first edge of the Hall bias signal occur at substantially the same time as the second edge of the indicator signal.

9. A method for biasing a Hall sensor, comprising:
comparing a first signal at a first output of the Hall sensor with a second signal at a second output of the Hall sensor to generate a comparison signal;
generating an indicator signal in response to the comparison signal, wherein the indicator signal has a first edge and a second edge; and
generating a bias signal for the Hall sensor in response to the indicator signal, the bias signal for the Hall sensor having a first edge and a second edge, wherein generating the bias signal for the Hall sensor includes generating the Hall bias signal to have the second edge of the Hall bias signal occur at substantially the same time as the second edge of the indicator signal.

\* \* \* \* \*